(12) United States Patent
Kishimoto et al.

(10) Patent No.: US 11,239,819 B2
(45) Date of Patent: Feb. 1, 2022

(54) ELASTIC WAVE DEVICE

(71) Applicant: Murata Manufacturing Co., Ltd., Nagaokakyo (JP)

(72) Inventors: Yutaka Kishimoto, Nagaokakyo (JP); Masashi Omura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 876 days.

(21) Appl. No.: 15/922,961

(22) Filed: Mar. 16, 2018

(65) Prior Publication Data
US 2018/0205362 A1 Jul. 19, 2018

Related U.S. Application Data

(63) Continuation of application No. PCT/JP2016/071724, filed on Jul. 25, 2016.

(30) Foreign Application Priority Data

Oct. 23, 2015 (JP) .............................. JP2015-208801

(51) Int. Cl.
*H03H 9/02* (2006.01)
*H03H 3/02* (2006.01)
(Continued)

(52) U.S. Cl.
CPC .......... *H03H 9/02929* (2013.01); *H03H 3/02* (2013.01); *H03H 3/08* (2013.01);
(Continued)

(58) Field of Classification Search
CPC ........... H03H 9/02897; H03H 9/02559; H03H 9/02535
(Continued)

(56) References Cited

U.S. PATENT DOCUMENTS

2009/0045704 A1   2/2009  Barber et al.
2010/0148638 A1   6/2010  Umeda
(Continued)

FOREIGN PATENT DOCUMENTS

CN   103283147 A    9/2013
JP   2013-258373 A   12/2013
(Continued)

OTHER PUBLICATIONS

Official Communication issued in corresponding Chinese Patent Application No. 201680055793.4, dated Sep. 23, 2020.
(Continued)

*Primary Examiner* — Derek J Rosenau
(74) *Attorney, Agent, or Firm* — Keating & Bennett, LLP

(57) ABSTRACT

An elastic wave device includes a supporting substrate, an acoustic multilayer film on the supporting substrate, a piezoelectric substrate on the acoustic multilayer film, and an IDT electrode on the piezoelectric substrate. The acoustic multilayer film includes at least four acoustic impedance layers. The at least four acoustic impedance layers include at least one low acoustic impedance layer and at least one high acoustic impedance layer having an acoustic impedance higher than the low acoustic impedance layer. The elastic wave device further includes a bonding layer provided at any position in a range of from inside the acoustic impedance layer, which is the fourth acoustic impedance layer from the piezoelectric substrate side towards the supporting substrate side, to an interface between the acoustic multilayer film and the supporting substrate.

16 Claims, 5 Drawing Sheets

(51) Int. Cl.
*H03H 9/17* (2006.01)
*H03H 9/145* (2006.01)
*H03H 3/08* (2006.01)
*H03H 9/05* (2006.01)
*H03H 9/25* (2006.01)
*H01L 41/047* (2006.01)
*H01L 41/29* (2013.01)
*H01L 41/312* (2013.01)

(52) U.S. Cl.
CPC .... *H03H 9/02228* (2013.01); *H03H 9/02559* (2013.01); *H03H 9/02637* (2013.01); *H03H 9/058* (2013.01); *H03H 9/0561* (2013.01); *H03H 9/145* (2013.01); *H03H 9/175* (2013.01); *H03H 9/25* (2013.01); *H01L 41/0477* (2013.01); *H01L 41/29* (2013.01); *H01L 41/312* (2013.01); *H03H 2003/025* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 2012/0274179 | A1* | 11/2012 | Nodake | H03H 3/04 310/313 C |
| 2013/0285768 | A1* | 10/2013 | Watanabe | H03H 3/02 333/193 |
| 2014/0152146 | A1* | 6/2014 | Kimura | H01L 41/1873 310/313 B |
| 2014/0225684 | A1* | 8/2014 | Kando | H03H 9/14594 333/195 |
| 2015/0231884 | A1* | 8/2015 | Kobayashi | B41J 2/14201 347/70 |

FOREIGN PATENT DOCUMENTS

KR 10-2010-0057803 A 6/2010
WO 2012/086441 A1 6/2012

OTHER PUBLICATIONS

Official Communication issued in International Patent Application No. PCT/JP2016/071724, dated Oct. 11, 2016.

* cited by examiner

ELASTIC WAVE DEVICE

CROSS REFERENCE TO RELATED APPLICATIONS

This application claims the benefit of priority to Japanese Patent Application No. 2015-208801 filed on Oct. 23, 2015 and is a Continuation Application of PCT Application No. PCT/JP2016/071724 filed on Jul. 25, 2016. The entire contents of each application are hereby incorporated herein by reference.

BACKGROUND OF THE INVENTION

1. Field of the Invention

The present invention relates to an elastic wave device for use in a resonator, a bandpass filter, or other suitable device.

2. Description of the Related Art

Heretofore, elastic wave devices have been widely used in resonators and bandpass filters. In such elastic wave devices, various elastic waves, such as Rayleigh waves and shear horizontal (SH) waves, are used.

In WO 2012/086441 A1, an elastic wave device that uses a plate wave is disclosed. In the elastic wave device described in WO 2012/086441 A1, an acoustic reflector layer, a piezoelectric layer, and an IDT electrode are stacked in that order on a supporting substrate. The acoustic reflector layer is defined by a low acoustic impedance layer and a high acoustic impedance layer having an acoustic impedance higher than the low acoustic impedance layer.

WO 2012/086441 A1 describes a method for producing an elastic wave device involving bonding a piezoelectric and a supporting substrate including an acoustic reflector layer preliminarily formed thereon. However, in some cases, deterioration of characteristics occurs depending on the position at which the piezoelectric and the supporting substrate including the acoustic reflector layer thereon are bonded.

SUMMARY OF THE INVENTION

Preferred embodiments of the present invention provide a decrease in the possibility of deterioration of the characteristics of elastic wave devices including an acoustic reflector layer.

An elastic wave device according to a preferred embodiment of the present invention includes a supporting substrate, an acoustic multilayer film on the supporting substrate, a piezoelectric substrate on the acoustic multilayer film, and an IDT electrode on the piezoelectric substrate. The acoustic multilayer film includes at least four acoustic impedance layers. The at least four acoustic impedance layers include at least one low acoustic impedance layer and at least one high acoustic impedance layer having an acoustic impedance higher than the low acoustic impedance layer. The elastic wave device further includes a bonding layer provided at any position in a range of from inside the fourth acoustic impedance layer from the piezoelectric substrate side towards the supporting substrate side, to an interface between the acoustic multilayer film and the supporting substrate.

In an elastic wave device according to a preferred embodiment of the present invention, the bonding layer is provided inside the fourth acoustic impedance layer.

In an elastic wave device according to a preferred embodiment of the present invention, the acoustic multilayer film includes at least five acoustic impedance layers, and the bonding layer is provided inside one of the acoustic impedance layers on the supporting substrate side with respect to the fourth acoustic impedance layer.

In an elastic wave device according to a preferred embodiment of the present invention, the acoustic multilayer film includes at least five acoustic impedance layers, and the bonding layer is provided at an interface between the fourth acoustic impedance layer and another one of the acoustic impedance layers or at an interface between the acoustic impedance layers on the supporting substrate side with respect to the fourth acoustic impedance layer.

In an elastic wave device according to a preferred embodiment of the present invention, the bonding layer is provided at an interface between the acoustic multilayer film and the supporting substrate.

In an elastic wave device according to a preferred embodiment of the present invention, a plate wave of an $S_0$ mode, an $A_0$ mode, an $A_1$ mode, an $SH_0$ mode, or an $SH_1$ mode is used as a propagating elastic wave.

In an elastic wave device according to a preferred embodiment of the present invention, the low acoustic impedance layer is made of silicon oxide. According to this preferred embodiment, the plate wave is able to be more efficiently confined.

In an elastic wave device according to a preferred embodiment of the present invention, the high acoustic impedance layer is made of platinum or silicon nitride. According to this preferred embodiment, the plate wave is able to be more efficiently confined.

According to preferred embodiments of the present invention, the possibility of deterioration of the characteristics of elastic wave devices each including an acoustic multilayer film is able to be decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to the drawings.

It should be noted that the preferred embodiments described in this description are only exemplary, and partially substituting or combining the features of different preferred embodiments is possible.

First Preferred Embodiment

Figure 1A:
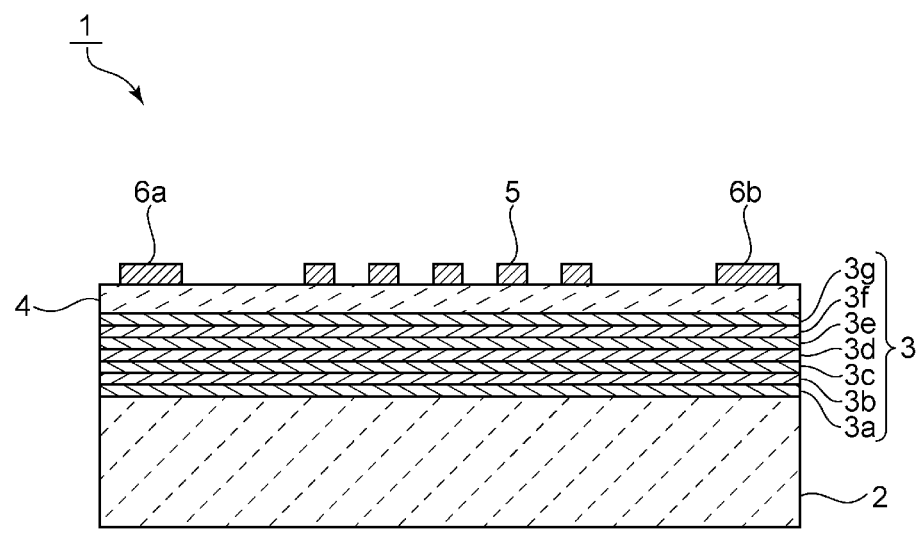
FIG. 1A is a schematic elevational cross-sectional view of an elastic wave device according to a first preferred embodiment of the present invention.
Figure 1B:
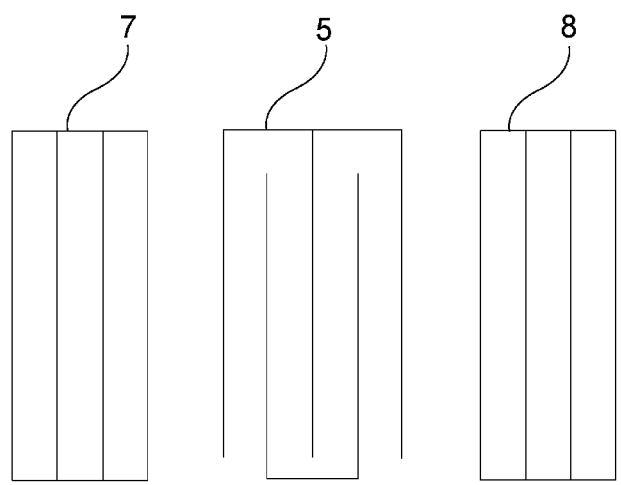
FIG. 1B is a schematic plan view of an electrode structure of the elastic wave device.
Figure 2:
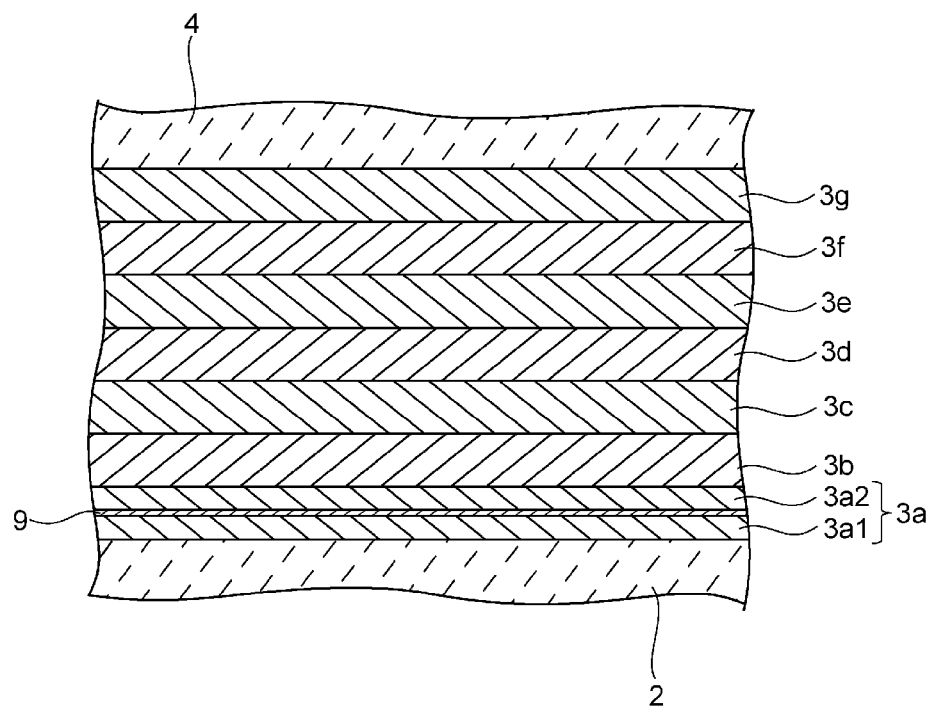
FIG. 2 is a partially cut-away schematic cross-sectional view illustrating an enlarged relevant portion of the elastic wave device according to the first preferred embodiment of the present invention.

FIG. 1A is a schematic elevational cross-sectional view of an elastic wave device according to a first preferred embodiment of the present invention, and FIG. 1B is a schematic plan view of an electrode structure of the elastic wave device. FIG. 2 is a partially cut-away schematic cross-sectional view illustrating an enlarged relevant portion of the elastic wave device according to the first preferred embodiment of the present invention.

The elastic wave device 1 uses a plate wave of an $S_0$ mode, an $A_0$ mode, an $A_1$ mode, an $SH_0$ mode, an $SH_1$ mode, or other suitable mode. The elastic wave device 1 includes a supporting substrate 2. An acoustic multilayer film 3 is stacked on the supporting substrate 2. A piezoelectric substrate 4 is stacked on the acoustic multilayer film 3. An IDT electrode 5 and electrode lands 6a and 6b are stacked on the piezoelectric substrate 4. The electrode lands 6a and 6b are electrically coupled to the IDT electrode 5.

The supporting substrate 2 is preferably made of Si, for example. The material that defines the supporting substrate 2 is not particularly limited, piezoelectrics such as sapphire, $LiTaO_3$, $LiNbO_3$, and crystal, dielectrics such as various ceramics and glass, e.g., alumina, magnesia, silicon nitride, aluminum nitride, silicon oxide, aluminum oxide, silicon carbide, zirconia, cordierite, mullite, steatite, and forsterite, and semiconductors such as silicon and gallium nitride, resins, for example, may be used.

In the present preferred embodiment, the acoustic multilayer film 3 includes low acoustic impedance layers 3a, 3c, 3e, and 3g and high acoustic impedance layers 3b, 3d, and 3f. The acoustic impedance of the high acoustic impedance layers 3b, 3d, and 3f is higher than the acoustic impedance of the low acoustic impedance layers 3a, 3c, 3e, and 3g. In the present preferred embodiment, the low acoustic impedance layers 3a, 3c, 3e, and 3g and high acoustic impedance layers 3b, 3d, and 3f are alternately arranged in the stacking direction.

In the present preferred embodiment, the low acoustic impedance layers 3a, 3c, 3e, and 3g and high acoustic impedance layers 3b, 3d, and 3f need not be alternately arranged in the stacking direction. However, from the viewpoint of further improving the plate wave confining efficiency, at least one of the low acoustic impedance layers 3a, 3c, 3e, and 3g is preferably provided on the piezoelectric substrate 4 side with respect to at least one of the high acoustic impedance layers 3b, 3d, and 3f. Furthermore, among the at least four acoustic impedance layers provided, the low acoustic impedance layers and the high acoustic impedance layers are more preferably alternately stacked.

From the viewpoint of further efficiently confining the energy of the plate wave, the thickness of each of the acoustic impedance layers defining the acoustic multilayer film 3 is preferably in the range of about 1/10 of the thickness of the piezoelectric substrate 4 to about 4 times the thickness of the piezoelectric substrate 4. The thickness of each of the acoustic impedance layers may be the same as or different from the thickness of the piezoelectric substrate 4.

In the elastic wave device 1, the acoustic multilayer film 3 preferably includes seven acoustic impedance layers, for example. The number of acoustic impedance layers stacked is at least four as in the present preferred embodiment. In some cases, the plate wave cannot be efficiently confined if the number of stacked acoustic impedance layers is small. The upper limit of the number of acoustic impedance layers stacked is not particularly limited but is preferably about 20, for example.

The low acoustic impedance layers 3a, 3c, 3e, and 3g are preferably made of $SiO_2$, for example. Alternatively, the low acoustic impedance layers 3a, 3c, 3e, and 3g may be made of Al, Ti, or other suitable material.

The high acoustic impedance layers 3b, 3d, and 3f are preferably made of Pt, for example. Alternatively, the high acoustic impedance layers 3b, 3d, and 3f may be made of AlN, W, $LiTaO_3$, $Al_2O_3$, $LiNbO_3$, SiN, $Ta_2O_5$, ZnO, or other suitable material.

In the present preferred embodiment, the bonding layer 9 is provided inside the low acoustic impedance layer 3a. More specifically, the low acoustic impedance layers 3a has a structure in which the low acoustic impedance layer segment 3a1 and a low acoustic impedance layer segment 3a2 are bonded together with the bonding layer 9. Thus, the bonding layer 9 is interposed between the low acoustic impedance layer segment 3a1 and the low acoustic impedance layer segment 3a2. A main surface of the low acoustic impedance layer segment 3a1, the main surface being on the opposite side from the bonding layer 9, is in contact with the supporting substrate 2. A main surface of the low acoustic impedance layer segment 3a2, the main surface being on the opposite side from the bonding layer 9, is in contact with the high acoustic impedance layer 3b. However, as will be described in the example below, the bonding layer 9 may be provided inside the fourth acoustic impedance layer from the piezoelectric substrate 4, or inside any one of or at the interface between any two of the acoustic impedance layers on the supporting substrate 2 side with respect to the fourth acoustic impedance layer.

The low acoustic impedance layer segments 3a1 and 3a2 are preferably made of the same material as that for the low acoustic impedance layer 3a. Thus, in the present preferred embodiment, $SiO_2$ is preferably used, for example.

The bonding layer 9 is preferably made of a Ti oxide, for example. The material for the bonding layer 9 is not limited to the Ti oxide, and may be an oxide of other metals, such as Al. Alternatively, instead of a metal oxide, metal, such as Ti or Al, may be used for the bonding layer 9. However, in order to enable electrical insulation, an insulating material is preferable. In particular, titanium oxide is preferred for its high bonding strength and because it is easy to impart an insulating property by oxidation.

The piezoelectric substrate 4 is preferably made of $LiNbO_3$, for example. However, a substrate made of a different piezoelectric single crystal, such as $LiTaO_3$, or a substrate made of a piezoelectric ceramic may be used as the piezoelectric substrate 4.

Although FIG. 1A is only a schematic view, an electrode structure illustrated in FIG. 1B is provided on the piezoelectric substrate 4. In other words, the IDT electrode 5 and reflectors 7 and 8, which are located on both sides of the IDT electrode 5 in the elastic wave propagation direction, are provided. As a result, a one-port-type elastic wave resonator is provided. However, the reflectors 7 and 8 are optional.

As illustrated in FIG. 1B, the IDT electrode 5 includes a first bus bar, a second bus bar, a plurality of first electrode fingers, and a plurality of second electrode fingers. The first electrode fingers and the second electrode fingers are interdigitated. The first electrode fingers are connected to the first bus bar, and the second electrode fingers are connected to the second bus bar.

When an alternating voltage is applied to the IDT electrode 5, the portion of the piezoelectric substrate 4 at which the IDT electrode 5 is provided is excited. The elastic wave device 1 uses the plate wave as the elastic wave generated by excitation of the IDT electrode 5 as described above.

Although omitted from the drawings of this preferred embodiment, a $SiO_2$ film, which defines and functions as a temperature adjusting film, may be provided to cover the IDT electrode 5 in preferred embodiments of the present invention.

The IDT electrode 5 and the electrode lands 6a and 6b are preferably made of Al, for example, in the present preferred embodiment. The IDT electrode 5 and the electrode lands 6a and 6b may be made of any appropriate metal, such as Al, Cu, Pt, Au, Ag, Ti, Ni, Cr, Mo, or W, or an alloy mainly composed of any of these metals. The IDT electrode 5 and the electrode lands 6a and 6b may be made of a multilayer metal film obtained by stacking a plurality of metal films.

In the elastic wave device 1, the low acoustic impedance layers 3a, 3c, 3e, and 3g and high acoustic impedance layers 3b, 3d, and 3f are alternately stacked. Thus, the plate wave propagating from the piezoelectric substrate 4 is reflected at the interfaces between the low acoustic impedance layers 3a, 3c, 3e, and 3g and the high acoustic impedance layers 3b, 3d, 3f, the interfaces being the upper surfaces of the low acoustic impedance layers 3a, 3c, 3e, and 3g. As a result, the energy of the plate wave is able to be efficiently confined.

In the elastic wave device 1, the bonding layer 9 is preferably provided inside the acoustic impedance layer 3a, which is the seventh layer from the piezoelectric substrate 4 side toward the supporting substrate 2 side. Thus, deterioration of the characteristics of the elastic wave device 1 is unlikely to occur.

Although the acoustic multilayer film 3 includes seven acoustic impedance layers in the elastic wave device 1, at least four acoustic impedance layers are preferably included. In preferred embodiments of the present invention, since the acoustic multilayer film 3 includes at least four acoustic impedance layers, the energy of the plate wave is able to be efficiently confined. This will now be described in detail with reference to an Experimental Example.

In the Experimental Example, an elastic wave device 1, which is a one-port-type elastic wave resonator, was prepared under the following conditions, and a $S_0$-mode plate wave was excited. Supporting substrate 2: Si (material)

Acoustic multilayer film 3: number of layers stacked: 2, 4, or 6, low acoustic impedance layer: $SiO_2$, high acoustic impedance layer: Pt Piezoelectric substrate 4: X—$LiNbO_3$ {Euler angles (90°, 90°, 40°)}

IDT electrode 5: AlCu (Cu about 1%, about 80 nm)/Ti (about 10 nm), duty ratio: about 0.5, number of pairs of electrode fingers: 100, intersecting width: about 25.5 μm FIG. 3 is a graph illustrating the impedance characteristics of the elastic wave device prepared in the Experimental Example when the number of stacked acoustic impedance layers defining the acoustic multilayer film is varied.

In the Experimental Example, when two acoustic impedance layers were to be stacked, the bonding layer was provide so as to define the third layer from the piezoelectric substrate 4 side. When four acoustic impedance layers were to be stacked, the bonding layer was provided so as to define the fifth layer from the piezoelectric substrate 4 side. When six acoustic impedance layers were to be stacked, the bonding layer was provided so to define the seventh layer from the piezoelectric substrate 4 side.

Figure 3:
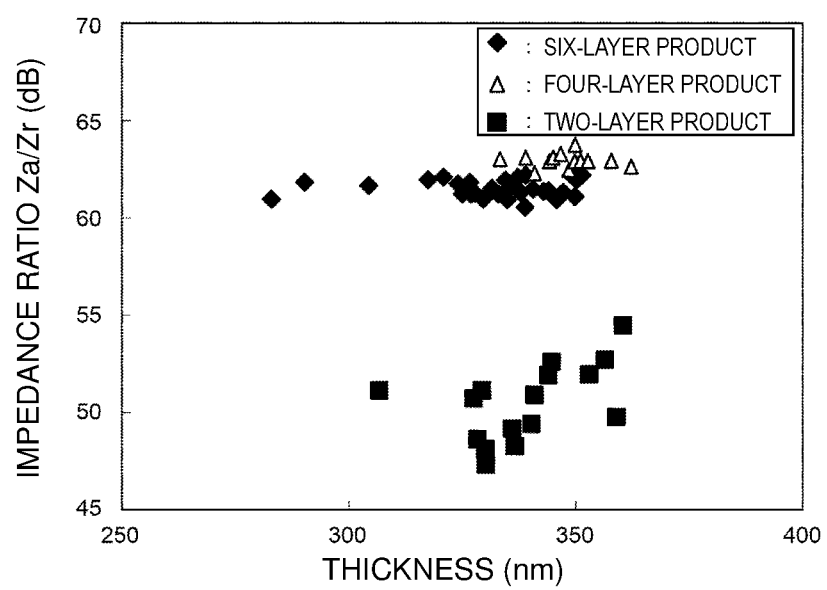
FIG. 3 is a graph illustrating the impedance characteristics of the elastic wave device prepared in an Experimental Example when the number of acoustic impedance layers stacked to define the acoustic multilayer film is varied.

Here, FIG. 3 shows that good impedance characteristics are obtained in the elastic wave devices 1 with four and six stacked acoustic impedance layers as compared to the elastic wave device 1 with two stacked acoustic impedance layers stacked.

Although not indicated in the graph, when four acoustic impedance layers were stacked and when the bonding position was set to be the fourth layer from the piezoelectric substrate 4 side and was set at the interface between the acoustic multilayer film 3 and the supporting substrate 2, good impedance characteristics were obtained in both cases. When six acoustic impedance layers were stacked and when the bonding position was set to be the fourth layer, the fifth layer, and a sixth layer from the piezoelectric substrate 4 side, and was at the interface between the acoustic multilayer film 3 and the supporting substrate 2, good impedance characteristics were obtained in all cases.

This shows that in order to efficiently confine the plate wave and obtain good impedance characteristics, at least four acoustic impedance layers are preferable and that the position of the bonding layer is preferably in a range from inside of the fourth acoustic impedance layer from the piezoelectric substrate side towards the supporting substrate side, to the interface between the acoustic multilayer film and the supporting substrate.

Thus, when the bonding layer is provided at any position in a range from inside the fourth acoustic impedance layer from the piezoelectric substrate side towards the supporting substrate side, to the interface between the acoustic multilayer film and the supporting substrate, deterioration of the characteristics is unlikely to occur.

Although the method for producing the elastic wave device 1 is not particularly limited, one example of a method according to a preferred embodiment of the present invention is described with reference to FIGS. 4A to 4D.

Figure 4A:
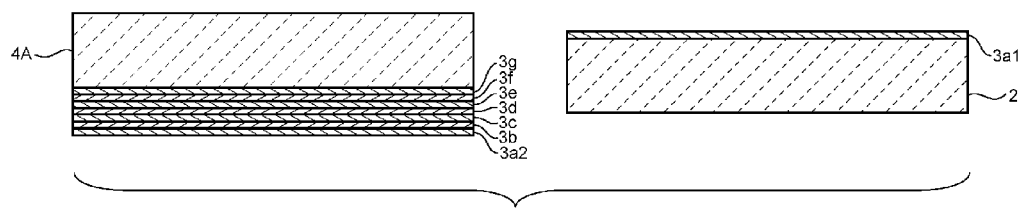
FIGS. 4A to 4D are each a schematic elevational cross-sectional view illustrating a method for producing the elastic wave device according to the first preferred embodiment of the present invention.

First, as illustrated in FIG. 4A, a piezoelectric plate 4A to obtain a piezoelectric substrate 4, and a supporting substrate 2 are prepared. A low acoustic impedance layer 3g formed of $SiO_2$ is formed on one main surface of the piezoelectric plate 4A. Then, preferably three high acoustic impedance layers 3f, 3d, and 3b formed of AlN and two low acoustic impedance layers 3e and 3c formed of $SiO_2$ are sequentially alternately stacked on the low acoustic impedance layer 3g starting from the high acoustic impedance layer 3f. Next, a low acoustic impedance layer segment 3a2 formed of $SiO_2$ is preferably stacked on the high acoustic impedance layer 3b.

A low acoustic impedance layer segment 3a1 formed of $SiO_2$ is formed on one main surface of the supporting substrate 2.

A plate formed of $LiNbO_3$ is used as the piezoelectric plate 4A. However, a plate made of a different piezoelectric single crystal, such as $LiTaO_3$, or a plate made of a piezoelectric ceramic may be used as the piezoelectric plate 4A.

Silicon (Si) is preferably used in the supporting substrate 2. However, piezoelectrics such as sapphire, LiTaO$_3$, LiNbO$_3$, and crystal, dielectrics such as various ceramics and glass, e.g., alumina, magnesia, silicon nitride, aluminum nitride, silicon oxide, aluminum oxide, silicon carbide, zirconia, cordierite, mullite, steatite, and forsterite, semiconductors such as silicon and gallium nitride, resins, for example, may be used in the supporting substrate 2.

The low acoustic impedance layers 3c, 3e, and 3g and low acoustic impedance layer segments 3a1 and 3a2 may be formed by a sputtering method, a vapor deposition method, a CVD method, or other suitable method, for example. Similarly, the high acoustic impedance layers 3b, 3d, and 3f may be formed by a sputtering method, a vapor deposition method, a CVD method, or other suitable method, for example. The acoustic impedance layers may be subjected to patterning as appropriate.

The thickness of each of the low acoustic impedance layers 3c, 3e, and 3g and the high acoustic impedance layers 3b, 3d, and 3f is not particularly limited, and may preferably be about 50 nm to about 2000 nm, for example.

Figure 4B:
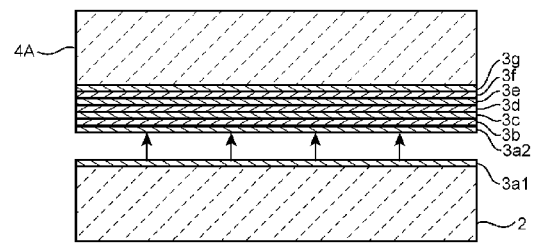

Next, the surface of the low acoustic impedance layer segment 3a2, which will form the bonding surface for the piezoelectric plate 4A, and the surface of the low acoustic impedance layer segment 3a1, which will form the bonding surface for the supporting substrate 2, are polished. After polishing, as illustrated in FIG. 4B, the piezoelectric plate 4A and the supporting substrate 2 are bonded to each other. For bonding the piezoelectric plate 4A and the supporting substrate 2 to each other, a bonding film, not illustrated in the drawing, and preferably made of Ti for forming the bonding layer 9 is interposed between the low acoustic impedance layer segment 3a2 on the piezoelectric plate 4A and the low acoustic impedance layer segment 3a1 on the supporting substrate 2, and diffusion bonding is performed to achieve bonding. The bonding method is not particularly limited and, for example, may be hydrophilic bonding or activated bonding.

Figure 4C:
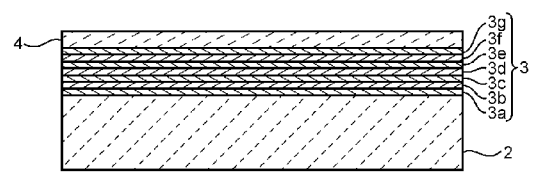

Next, as illustrated in FIG. 4C, the thickness of the piezoelectric plate 4A is reduced so that a plate wave is excitable so as to obtain the piezoelectric substrate 4. From the viewpoint of the excitation efficiency for the plate wave, the thickness of the piezoelectric substrate 4 is preferably about 1 µm or less, for example.

After the thickness of the piezoelectric plate 4A is reduced, a heat treatment is performed at a temperature of about 300° C. so that the bonding film made of Ti described above is oxidized and provides an insulating property.

Figure 4D:
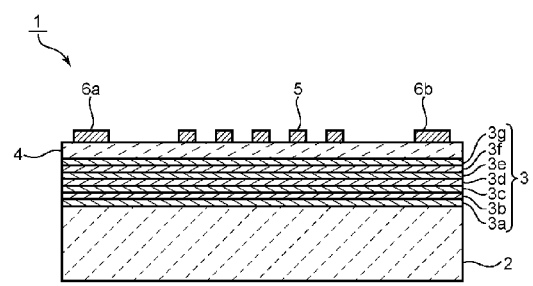

Lastly, as illustrated in FIG. 4D, an IDT electrode 5 and electrode lands 6a and 6b are formed on a main surface of the piezoelectric substrate 4, the main surface being on the opposite side from the acoustic multilayer film 3. As a result, the elastic wave device 1 is obtained.

The IDT electrode 5 and the electrode lands 6a and 6b may be formed by a vapor-deposition lift-off method, for example. The thickness of the IDT electrode 5 is not particularly limited but may preferably be about 10 nm to about 2000 nm, for example. The thickness of the electrode lands 6a and 6b is not particularly limited but may preferably be about 100 nm to about 2000 nm, for example.

In the present preferred embodiment, the IDT electrode 5 is preferably made of a multilayer metal film prepared by stacking Ti and AlCu (Cu 1%) in this order. The electrode lands 6a and 6b are each preferably made of a multilayer metal film prepared by stacking Ti and Al in this order.

Second Preferred Embodiment

Figure 5:
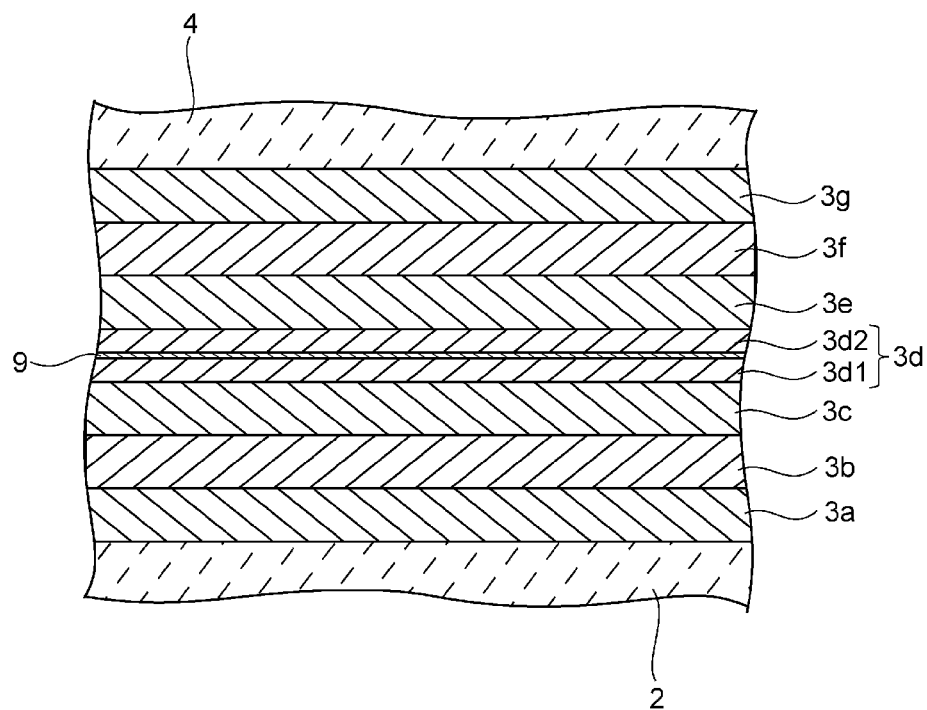
FIG. 5 is a partially cut-away schematic cross-sectional view illustrating an enlarged relevant portion of an elastic wave device according to a second preferred embodiment of the present invention.

FIG. 5 is a partially cut-away schematic cross-sectional view illustrating an enlarged relevant portion of the elastic wave device according to a second preferred embodiment of the present invention. As illustrated in FIG. 5, in the second preferred embodiment, the high acoustic impedance layer 3d has a structure obtained by bonding a high acoustic impedance layer segment 3d1 and a high acoustic impedance layer segment 3d2 to each other with the bonding layer 9. Thus, the bonding layer 9 is provided inside the high acoustic impedance layer 3d. The high acoustic impedance layer segment 3d1 and the high acoustic impedance layer segment 3d2 may preferably be made of the same material as that for the high acoustic impedance layers 3b and 3f.

In the second preferred embodiment, during production, the high acoustic impedance layer segment 3d1 and the high acoustic impedance layer segment 3d2 may be bonded to each other by using a Ti bonding film or other suitable film by the same or substantially the same method as in the first preferred embodiment.

In the second preferred embodiment also, since the bonding layer 9 is provided inside the acoustic impedance layer 3d, which is the fourth acoustic impedance layer from the piezoelectric substrate 4 side towards the supporting substrate 2 side, the plate wave is able to be highly efficiently confined and deterioration of the characteristics is unlikely to occur.

As in the elastic wave devices of the first and second preferred embodiments, the bonding layer 9 may be provided inside the acoustic impedance layer 3d, which is the fourth acoustic impedance layer from the piezoelectric substrate 4 side towards the supporting substrate 2 side, or, may be provided inside the acoustic impedance layer on the supporting substrate 2 side with respect to the fourth acoustic impedance layer 3d.

Third and Fourth Preferred Embodiments

Figure 6:
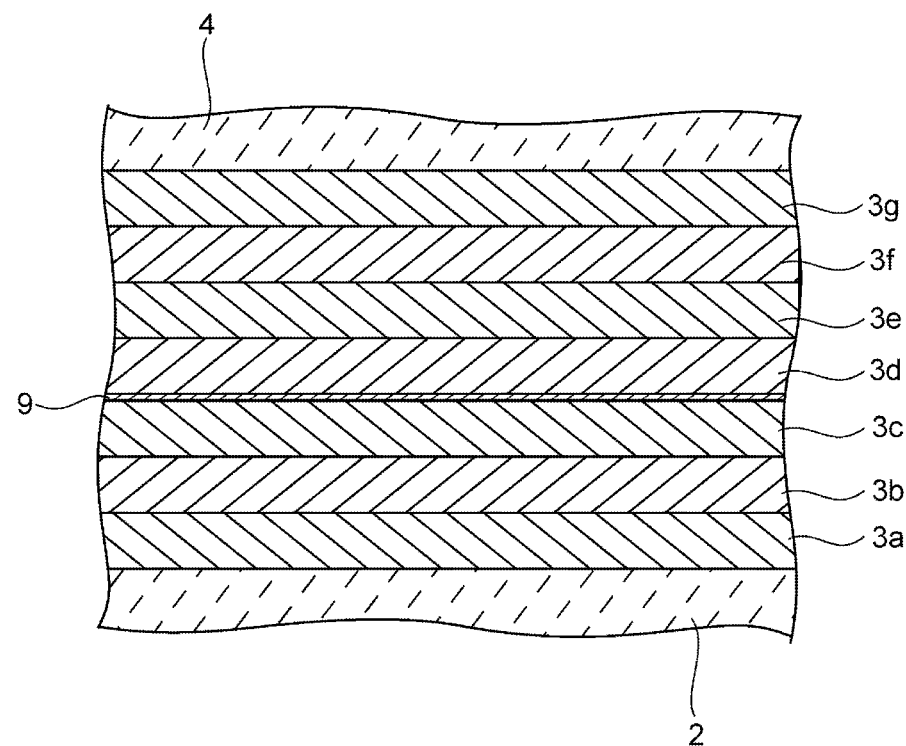
FIG. 6 is a partially cut-away schematic cross-sectional view illustrating an enlarged relevant portion of an elastic wave device according to a third preferred embodiment of the present invention.

FIG. 6 is a partially cut-away schematic cross-sectional view illustrating an enlarged relevant portion of the elastic wave device according to a third preferred embodiment of the present invention. As illustrated in FIG. 6, in the third preferred embodiment, the bonding layer 9 is provided at the interface between the high acoustic impedance layer 3d and the low acoustic impedance layer 3c. In other words, the bonding layer 9 is provided at the interface between the acoustic impedance layer 3d, which is the fourth acoustic impedance layer from the piezoelectric substrate 4 side towards the supporting substrate 2 side, and the acoustic impedance layer 3c, which is the fifth acoustic impedance layer.

Figure 7:
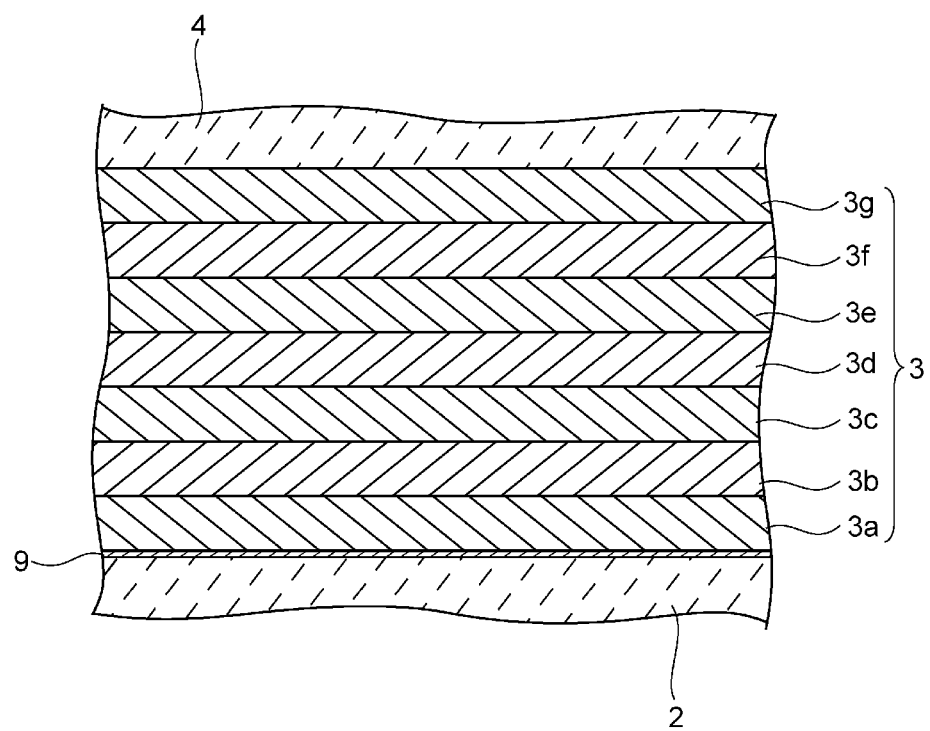
FIG. 7 is a partially cut-away schematic cross-sectional view illustrating an enlarged relevant portion of an elastic wave device according to a fourth preferred embodiment of the present invention.

FIG. 7 is a partially cut-away schematic cross-sectional view illustrating an enlarged relevant portion of the elastic wave device according to a fourth preferred embodiment of the present invention. As illustrated in FIG. 7, in the fourth preferred embodiment, the bonding layer 9 is provided at the interface between the acoustic multilayer film 3 and the supporting substrate 2.

In the third and fourth preferred embodiments, during production, the acoustic impedance layers may be bonded to each other or the acoustic multilayer film 3 and the supporting substrate 2 may be bonded to each other by using a Ti bonding film or other suitable film by the same or substantially the same method as in the first preferred embodiment.

As illustrated in the third and fourth preferred embodiments, the bonding layer 9 may be provided at the interface between the acoustic impedance layers on the supporting substrate 2 side with respect to the acoustic impedance layer 3d, which is the fourth acoustic impedance layer from the piezoelectric substrate 4 side towards the supporting substrate 2 side, or may be provided at the interface between the acoustic multilayer film 3 and the supporting substrate 2. In each case, the same or substantially the same advantageous effects are obtained as in the first and second preferred embodiments.

As described above, in preferred embodiments of the present invention, the bonding layer 9 is provided at any position in the range of from inside the acoustic impedance layer 3d, which is the fourth acoustic impedance layer from the piezoelectric substrate 4 side toward the supporting substrate 2 side, to the interface between the acoustic multilayer film 3 and the supporting substrate 2. Thus, elastic wave devices according to preferred embodiments of the present invention are able to highly efficiently confine the plate wave, and deterioration of the characteristics is unlikely to occur.

Elastic wave devices according to preferred embodiments of the present invention are widely used in various electronic appliances and communication appliances. An example of the electronic appliances is a sensor. Examples of the communication appliances include a duplexer that includes an elastic wave device according to a preferred embodiment of the present invention, a communication module appliance that includes an elastic wave device according to a preferred embodiment of the present invention, and a power amplifier (PA) and/or a low noise amplifier (LNA) and/or a switch (SW), and a mobile communication appliance and a healthcare communication appliance that include the communication module appliance. Examples of the mobile communication appliance include cellular phones, smart phones, and car navigation systems. Examples of the healthcare communication appliance include a body weight meter and a body fat meter. The healthcare communication appliance and the mobile communication appliance are each equipped with an antenna, an RF module, an LSI, a display, an input unit, a power supply, and other suitable components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a supporting substrate;
an acoustic multilayer film on the supporting substrate;
a piezoelectric substrate on the acoustic multilayer film; and
an IDT electrode on the piezoelectric substrate;
wherein
the acoustic multilayer film includes at least four acoustic impedance layers;
the at least four acoustic impedance layers include at least one low acoustic impedance layer and at least one high acoustic impedance layer having an acoustic impedance higher than the low acoustic impedance layer; and
a bonding layer provided inside a fourth acoustic impedance layer of the at least four acoustic impedance layers from the piezoelectric substrate side towards the supporting substrate side.

2. The elastic wave device according to claim 1, wherein the acoustic multilayer film includes at least five acoustic impedance layers.

3. The elastic wave device according to claim 1, wherein a plate wave of an $S_0$ mode, an $A_0$ mode, an $A_1$ mode, an $SH_0$ mode, or an $SH_1$ mode is used as a propagating elastic wave.

4. The elastic wave device according to claim 1, wherein the low acoustic impedance layer is made of silicon oxide.

5. The elastic wave device according to claim 1, wherein the high acoustic impedance layer is made of platinum or silicon nitride.

6. The elastic wave device according to claim 1, wherein the supporting substrate is made of Si.

7. The elastic wave device according to claim 1, wherein a thickness of each of the acoustic impedance layers is in a range of about 1/10 of a thickness of the piezoelectric substrate to about 4 times the thickness of the piezoelectric substrate.

8. The elastic wave device according to claim 1, wherein the bonding layer is made of a Ti oxide.

9. The elastic wave device according to claim 1, wherein the IDT electrode is made of at least one of Al, Cu, Pt, Au, Ag, Ti, Ni, Cr, Mo, or W, or an alloy primarily including any of Al, Cu, Pt, Au, Ag, Ti, Ni, Cr, Mo, or W.

10. The elastic wave device according to claim 1, wherein the IDT electrode is made of Al.

11. The elastic wave device according to claim 1, wherein the IDT electrode is defined by a multilayer metal film including a Ti layer and an AlCu that are stacked on one another.

12. The elastic wave device according to claim 1, further comprising electrode lands provided on the piezoelectric substrate.

13. The elastic wave device according to claim 12, wherein the electrode layers are defined by a multilayer metal film including a Ti layer and an Al layer that are stacked on one another.

14. The elastic wave device according to claim 1, wherein a thickness of the IDT electrode is about 10 nm to about 2000 nm.

15. The elastic wave device according to claim 12, wherein a thickness of each of the electrode lands is about 100 nm to about 2000 nm.

16. An elastic wave device comprising:
a supporting substrate;
an acoustic multilayer film on the supporting substrate;
a piezoelectric substrate on the acoustic multilayer film; and
an IDT electrode on the piezoelectric substrate; wherein
the acoustic multilayer film includes at least five acoustic impedance layers;
the at least five acoustic impedance layers include at least one low acoustic impedance layer and at least one high acoustic impedance layer having an acoustic impedance higher than the low acoustic impedance layer; and
the bonding layer is provided inside one of the at least five acoustic impedance layers on the supporting substrate side with respect to a fourth acoustic impedance layer of the at least five acoustic impedance layers from the piezoelectric substrate side towards the supporting substrate side.

* * * * *